US009082620B1

(12) United States Patent
Wang et al.

(10) Patent No.: US 9,082,620 B1
(45) Date of Patent: Jul. 14, 2015

(54) SEMICONDUCTOR DEVICE (71) Applicant: Macronix International Co., Ltd., Hsinchu (TW)

(72) Inventors: Shih Yu Wang, Taipei (TW); Yao-Wen Chang, Zhubei (TW); Tao-Cheng Lu, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/150,638

(22) Filed: Jan. 8, 2014

(51) Int. Cl.
*H01L 29/74* (2006.01)
*H01L 31/111* (2006.01)
*H01L 27/02* (2006.01)
*H01L 29/08* (2006.01)

(52) U.S. Cl.
CPC ........ *H01L 27/0262* (2013.01); *H01L 29/0834* (2013.01); *H01L 29/0839* (2013.01); *H01L 29/0847* (2013.01)

(58) Field of Classification Search
CPC . H01L 27/02; H01L 27/0248; H01L 27/0292; H01L 27/14609; H01L 27/24; H01L 22/34; H01L 29/00; H01L 51/05; H01L 2229/00
See application file for complete search history.

(56) References Cited

U.S. PATENT DOCUMENTS

2014/0362482 A1* 12/2014 Huang et al. .................... 361/56

* cited by examiner

*Primary Examiner* — Hoai V Pham
(74) *Attorney, Agent, or Firm* — Finnegan, Henderson, Farabow, Garrett & Dunner LLP (57) ABSTRACT

A semiconductor device includes a substrate, and first and second wells formed in the substrate. The first well has a first conductivity type. The second well has a second conductivity type different than the first conductivity type. The device includes a first heavily-doped region having the first conductivity type and a second heavily-doped region having the first conductivity type. A portion of the first heavily-doped region is formed in the first well. The second heavily-doped region is formed in the second well. The device also includes an insulating layer formed over a channel region of the substrate between the first and second heavily-doped regions, and a gate electrode formed over the insulating layer. The device further includes a terminal for coupling to a circuit being protected, and a switching circuit coupled between the terminal and the first heavily-doped region, and between the terminal and the gate electrode.

16 Claims, 8 Drawing Sheets

SEMICONDUCTOR DEVICE

TECHNOLOGY FIELD

The disclosure relates to a semiconductor device and, more particularly, to a semiconductor device including a silicon-controlled rectifier (SCR) structure for electrostatic discharge (ESD) protection.

BACKGROUND

Electrostatic discharge (ESD) is a natural phenomenon occurring frequently in daily life. ESD can generate a large current in a short period of time. When the large current generated by the ESD passes through an integrated circuit in a short period of time, it may result in a power consumption much higher than what the integrated circuit can bear, causing physical damage to the integrated circuit and, possibly, circuit failure. In fact, ESD has become a major factor that causes failure of integrated circuits during their manufacture and use.

One approach to reduce or avoid damage caused by ESD is to use an ESD protection device or circuit to protect the integrated circuit. A silicon-controlled rectifier (SCR) is one of the devices suitable for use in ESD protection purpose, because of its high current capability and small layout area. However, a conventional SCR has several disadvantages, such as high trigger voltage ($V_{tr}$, the voltage above which the SCR is turned on), low holding voltage ($V_h$, the voltage below which the SCR is turned off), and slow turn-on speed.

SUMMARY

In accordance with the disclosure, there is provided a semiconductor device including a substrate, and a first well and a second well formed in the substrate. The first well has a first conductivity type while the second well has a second conductivity type different than the first conductivity type. The device also includes a first heavily-doped region having the first conductivity type and a second heavily-doped region having the first conductivity type. A portion of the first heavily-doped region is formed in the first well. The second heavily-doped region is formed in the second well. The device also includes an insulating layer formed over a channel region of the substrate between the first and second heavily-doped regions, and a gate electrode formed over the insulating layer. The gate electrode, the insulating layer, the channel region, and the first and second heavily-doped regions form an embedded field-effect transistor (FET). The device further includes a terminal for coupling to an external circuit to be protected, and a switching circuit coupled between the terminal and the first heavily-doped region, and between the terminal and the gate electrode.

Features and advantages consistent with the disclosure will be set forth in part in the description which follows, and in part will be obvious from the description, or may be learned by practice of the disclosure. Such features and advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Embodiments consistent with the disclosure include a semiconductor device having a silicon-controlled rectifier (SCR) structure for electrostatic discharge (ESD) protection.

Hereinafter, embodiments consistent with the disclosure will be described with reference to the drawings. Wherever possible, the same reference numbers will be used throughout the drawings to refer to the same or like parts.

A silicon-controlled rectifier (SCR) is a device that can be used for ESD protection. As used herein, an SCR includes an N-well and a P-well formed adjacent to each other, with a heavily doped P-type ($P^+$) region and a heavily doped N-type ($N^+$) region formed in the N-well and the P-well, respectively. Therefore, the basic structure of the SCR includes a PNPN structure, where the $P^+$ region, the N-well, and the P-well form a PNP transistor, while the N-well, the P-well, and the $N^+$ region form an NPN transistor.

In operation, the SCR is usually connected in parallel with an external circuit to be protected. In accordance with one typical arrangement for connecting the SCR to the external circuit to be protected, an anode of the SCR is connected to a place in the external circuit where an ESD is likely to occur. A cathode of the SCR is connected to a circuit ground, which may also be the ground for the external circuit. When there is no ESD, the SCR is in a high-resistance state, so that the SCR does not interfere the operation of the external circuit. When the ESD occurs, excessive charges are generated by the ESD at the anode of the SCR, which increase the voltage applied to the SCR at the anode. When the voltage applied to the SCR becomes higher than the trigger voltage $V_{tr}$ of the SCR, avalanche breakdown may occur at the N-P junction formed by the N-well and the P-well. The current generated by the breakdown turns on one of the PNP transistor or the NPN transistor. Both of the PNP and the NPN transistors then become saturated. As a result, the SCR enters into a low-resistance state, i.e., is turned on, and starts to conduct the major portion of the excessive charges generated by the ESD. Consequently, the external circuit being protected bears only a minor portion of the ESD charges, and thus avoids being damaged. After the SCR enters into the low-resistance state and the ESD charges are being conducted by the SCR, the voltage applied to the SCR decreases. When the voltage applied to the SCR becomes lower than the holding voltage $V_h$ of the SCR, the SCR turns off.

Figure 1A:
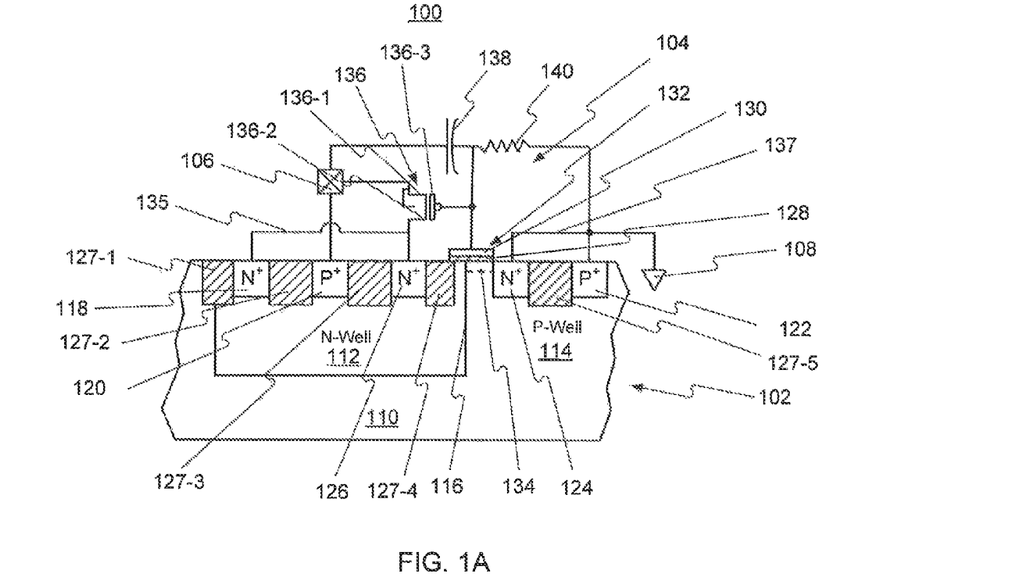
FIGS. 1A and 1B schematically show a semiconductor device according to an exemplary embodiment.

FIG. 1A is a sectional view schematically showing an exemplary semiconductor device 100 consistent with embodiments of the disclosure. The semiconductor device 100 includes a gate-coupled SCR 102 and a switching circuit 104. FIG. 1A shows a cross-section of the gate-coupled SCR 102. The semiconductor device 100 further includes a terminal 106 for coupling to the external circuit to be protected. The terminal 106 serves as the anode of the gate-coupled SCR 102. The semiconductor device 100 also includes a circuit ground 108, which provides a reference electrical potential to the semiconductor device 100 and may be coupled to a ground of the external circuit to be protected. Alternatively or in addition, the circuit ground 108 may be coupled to earth. The circuit ground 108 serves as the cathode of the gate-coupled SCR 102.

The gate-coupled SCR 102 includes a substrate 110, as well as an N-well 112 and a P-well 114 formed in the substrate 110. As shown in FIG. 1A, the N-well 112 and the P-well 114 are arranged side by side and meet at an interface 116.

In some embodiments, the N-well 112 and the P-well 114 may be formed by doping N-type impurities and P-type impurities, respectively, into the substrate 110 via, for example, implantation or diffusion. In some embodiments, such as that shown in FIG. 1A, the substrate 110 is a P-type substrate. In such embodiments, the N-well 112 may be formed by doping N-type impurities into a portion of the P-type substrate 110, while another portion of the P-type substrate 110 that is not doped with the N-type impurities is used as the P-well 114.

Alternatively, in some embodiments, the substrate 110 may be an N-type substrate. In these embodiments, the P-well 114 may be formed by doping P-type impurities into a portion of the N-type substrate 110, and another portion of the N-type substrate 110 that is not doped with the P-type impurities is used as the N-well 112.

In some embodiments, the substrate 110, whether P-type or N-type, may be a silicon substrate or a silicon-on-insulator (SOI) substrate. The N-type impurities for forming the N-well 112, and those in the substrate 110 when the substrate 110 is provided as N-type, include phosphorus, arsenic, or antimony. The P-type impurities for forming the P-well 114, and those in the substrate 110 when the substrate 110 is provided as P-type, include boron or aluminum. The impurity concentrations in the N-well 112 and the P-well 114 may be about $1e17$ cm$^{-3}$ to about $1e18$ cm$^{-3}$ and about $1e17$ cm$^{-3}$ to about $1e18$ cm$^{-3}$, respectively.

As shown in FIG. 1A, a heavily-doped N-type region (referred to herein as an N$^+$ region) 118 and a heavily-doped P-type region (referred to herein as a P$^+$ region) 120 are formed in the N-well 112. Similarly, a P$^+$ region 122 and an N$^+$ region 124 are formed in the P-well 114. The N$^+$ region 118 serves as an N-well pickup so that a good ohmic contact can be made to the N-well 112. Similarly, the P$^+$ region 122 serves as a P-well pickup so that a good ohmic contact can be made to the P-well 114. In the semiconductor device 100 shown in FIG. 1A, the N-well 112 also includes another N$^+$ region 126, which serves as an extra N-well pickup. In the semiconductor device 100, the N$^+$ region 126 is completely formed in the N-well 112.

The heavily-doped regions 118, 120, 122, 124, and 126 have a doping level (impurity concentration) higher than that of the N-well 112 and the P-well 114. In some embodiments, the doping level in the heavily-doped regions 118, 120, 122, 124, or 126 is more than two orders, such as three to four orders, of magnitude higher than the doping level in the N-well 112 or the P-well 114. The N$^+$ regions 118, 124, and 126 are doped with N-type impurities, such as phosphorus, arsenic, or antimony. The P$^+$ regions 120 and 122 are doped with P-type impurities, such as boron or aluminum. In some embodiments, the impurity concentration in each of the heavily-doped regions 118, 120, 122, 124, and 126 may be about $1e20$ cm$^{-3}$ to about $1e21$ cm$^{-3}$. The concentrations in these heavily-doped regions may be the similar to or different from each other.

As shown in FIG. 1A, insulating isolation layers 127-1, 127-2, 127-3, 127-4, and 127-5 are formed in the substrate 110 and near a surface of the substrate 110. The insulating isolation layers separate one heavily-doped region from a neighboring heavily-doped region to reduce the chance of breakdown, which may occur between neighboring heavily-doped regions when voltage experienced by the semiconductor device 100 is high or when a distance between neighboring heavily-doped regions is small. With the insulating isolation layers, the distance between neighboring heavily-doped regions may be made smaller than that in a situation without the insulating isolation layers. Therefore, the semiconductor device 100 can be made smaller. The insulating isolation layers 127-1, 127-2, 127-3, 127-4, and 127-5 may include, for example, field oxides or shallow trench isolations.

An insulating layer 128 is formed over the substrate 110. A gate electrode 130 is formed over the insulating layer 128. As shown in FIG. 1A, the insulating layer 128 and the gate electrode 130 are formed over the P-well 114 and the N-well 112. The N$^+$ regions 124 and 126, the insulating layer 128, the gate electrode 130, and a region in the substrate 110, particularly in the P-well 114, between the N$^+$ regions 124 and 126 form an embedded n-channel field-effect transistor (FET) 132, in which the region in the substrate 110, particularly in the P-well 114, between the N$^+$ regions 124 and 126 serves as a channel region 134. In FIG. 1A, as well as in FIGS. 1C, 5A, 6A, 6C, and 7A discussed below, the channel region is schematically depicted. The dashed line in these figures does not define the actual boundary of the channel region.

In some embodiments, the semiconductor device 100 may be fabricated by a CMOS process, during which, ion implantations for forming the heavily-doped regions are performed after the insulating layer 128 and the gate electrode 130 of the embedded n-channel FET 132 are formed. Therefore, in FIG. 1A, an edge of the insulating layer 128 and that of the gate electrode 130 align with an edge of the N$^+$ region 124. Similar alignments of the edges of the insulating layer 128 and the gate electrode 130 with an edge of a heavily-doped region are also shown in figures described below. However, in some embodiments, the semiconductor device 100 may be fabricated using a different process, and such alignments may not be necessary. Moreover, in FIG. 1A, another edge of the insulating layer 128 and that of the gate electrode 130 are formed over the insulating isolation layer 127-4. In some embodiments, such edges may also be aligned with an edge, such as the right edge, of the insulating isolation layer 127-4.

As shown in FIG. 1A, the N$^+$ regions 118 and 126 are electrically coupled to each other, as diagrammatically shown by a connection 135. The P$^+$ region 120 is electrically coupled to the terminal 106. The P$^+$ region 122 and the N$^+$ region 124 are electrically coupled to each other, as diagrammatically shown by a connection 137, and also electrically coupled to the circuit ground 108. Electrical coupling between different portions of a semiconductor device consistent with embodiments of the disclosure may be realized using, for example, metal wires, polysilicon layers, or embedded heavily-doped regions in the substrate 110.

Figure 1B:
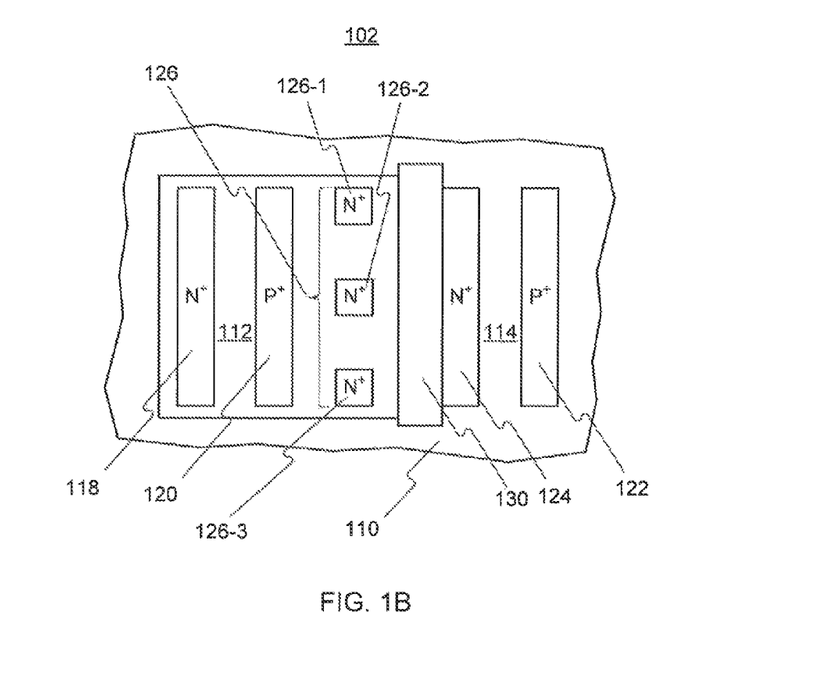

FIG. 1B is a plan view schematically showing the layout of the gate-coupled SCR 102. In FIG. 1B, the insulating isolation layers 127-1, 127-2, 127-3, 127-4, and 127-5 are not depicted. As shown in FIG. 1B, each of the heavily-doped regions 118, 120, 122, and 124 has an elongated shape extending in a direction substantially parallel to the interface 116. The N$^+$ region 126 includes a plurality of sub-regions 126-1, 126-2, and 126-3, arranged along a direction substantially parallel to the interface 116, i.e., substantially parallel to the directions along which the other heavily-doped regions 118, 120, 122, and 124 extend.

Referring again to FIG. 1A, the switching circuit 104 includes a p-channel FET 136, a capacitor 138, and a resistor 140. The p-channel FET 136 includes a source electrode 136-1 electrically coupled to the terminal 106, a drain electrode 136-2 electrically coupled to the N$^+$ regions 118 and 126, and a gate electrode 136-3 electrically coupled to the gate electrode 130 of the embedded n-channel FET 132.

The capacitor 138 and the resistor 140 are electrically coupled to each other to form an RC coupling. The gate electrode 130 of the embedded n-channel FET 132 and the gate electrode 136-3 of the p-channel FET 136 are electrically coupled to the terminal 106 through the capacitor 138, and are electrically coupled to the P$^+$ region 122 and the N$^+$ region 124, as well as the circuit ground 108, through the resistor 140.

Figure 1C:
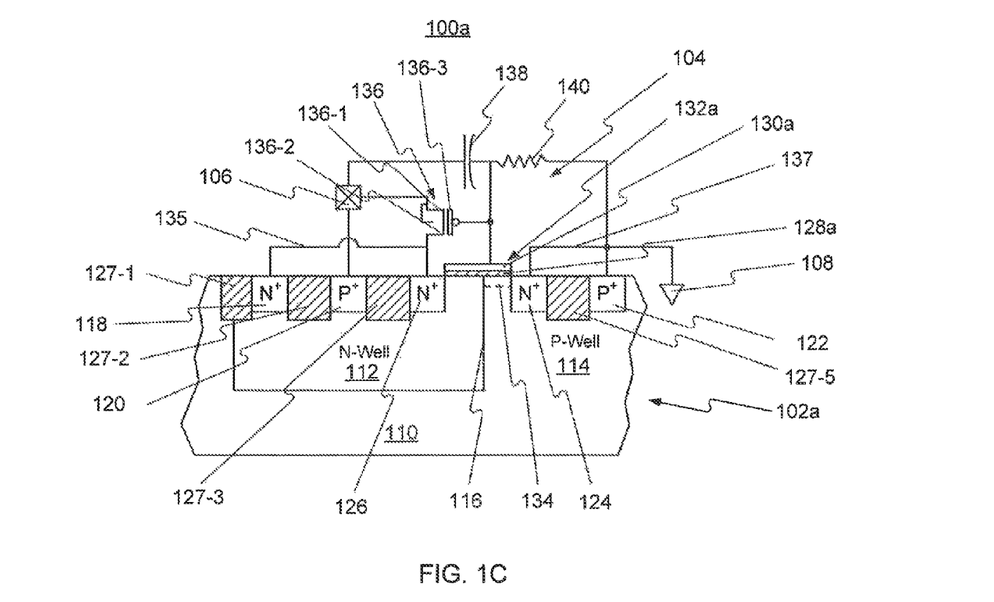
FIGS. 1C and 1D schematically show a modification of the semiconductor device shown in FIGS. 1A and 1B.
Figure 1D:
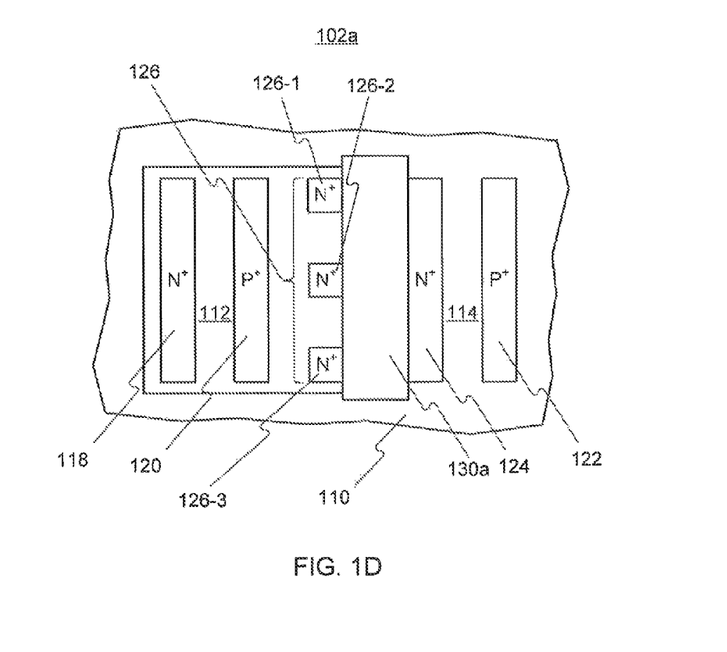

FIGS. 1C and 1D schematically show sectional and plan views, respectively, of a modification, i.e., semiconductor device 100a, of the semiconductor device 100. The semiconductor device 100a differs from the semiconductor device 100 in that a gate-coupled SCR 102a of the semiconductor device 100a does not have the insulating isolation layer 127-4 formed therein. Moreover, in the semiconductor device 100a, an embedded n-channel FET 132a is formed instead of the embedded n-channel FET 132, in which a left edge of an insulating layer 128a and that of a gate electrode 130a align with a right edge of the N$^+$ region 126. In semiconductor device 100a, since there is no insulating isolation layer between the N$^+$ regions 124 and 126, i.e., the source/drain regions of the embedded n-channel FET 132, more current can pass through the embedded n-channel FET 132, and thus the semiconductor device 100a, when ESD occurs.

During normal operation, since the electrical potential at the terminal 106 is at a normal level, the p-channel FET 136 is turned on and the embedded n-channel FET 132 is turned off. That is, during normal operation, the p-channel FET 136 is capable of conducting electrical current between the source electrode 136-1 and the drain electrode 136-2. Therefore, both the N$^+$ region 118, i.e., the N-well pickup, and the N$^+$ region 126, i.e., the extra N-well pickup, are electrically connected to the terminal 106 through the p-channel FET 136. Due to the presence of the N$^+$ region 126, i.e., the extra N-well pickup, the total width of the N$^+$ region serving as the N-well pickup increases as compared to a scenario in which only the N$^+$ region 118 is provided as the N-well pickup. As a consequence, both V$_{tr}$ and V$_h$ of the gate-coupled SCR 102 during the normal operation (here also referred to as "normal V$_{tr}$" and "normal V$_h$," respectively) are relatively high as compared to the scenario in which only the N$^+$ region 118 is provided as the N-well pickup.

Consistent with the present embodiment, the normal V$_h$ of the gate-coupled SCR 102 may be adjusted by adjusting a width of the N$^+$ region 126, i.e., the extra N-well pickup, or a width of the p-channel transistor 136. As used in this disclosure, the width of the N$^+$ region 126 is the dimension of the N$^+$ region 126 in a direction that is substantially parallel to the interface 116. The width of the p-channel transistor 136 is the width of the gate electrode 136-3, i.e., the dimension of the gate electrode 136-3 in a direction that is substantially perpendicular to a direction from the source electrode 136-1 to the drain electrode 136-2. Consistent with the disclosure, the normal V$_h$ increases with increasing the width of the N$^+$ region 126 or with increasing the width of the p-channel transistor 136. The width of the N+ region 126 may be adjusted by adjusting, for example, the number of sub-regions 126-1, 126-2, and 126-3 of the N+ region 126, or the width of one or more of the sub-regions 126-1, 126-2, and 126-3.

By the adjustments described above, the normal V$_h$ can be set to be higher than an operating voltage V$_{op}$ of the external circuit being protected by the semiconductor device 100, that is, the voltage applied to the terminal 106 during normal operation. As described above, during normal operation, since the p-channel FET 136 is on and the embedded n-channel FET 132 is off, the normal V$_h$ determines the holding voltage of the gate-coupled SCR 102. Moreover, during normal operation, the voltage applied to the terminal 106 switches between a high voltage level approximately equaling the operating voltage V$_{op}$ and a low voltage level approximately equaling 0 V. That is, during normal operation, even when the high voltage level is applied to the terminal 106, such a voltage is still lower than the holding voltage of the gate-coupled SCR 102, and thus latch-up should not occur.

When ESD occurs, since the electrical potential at the terminal 106 increases, the p-channel FET 136 is turned off and thus the N$^+$ region 118, i.e., the N-well pickup, and the N$^+$ region 126, i.e., the extra N-well pickup, become floating. In such a scenario, the holding voltage V$_h$ (here referred to as ESD V$_h$) is smaller than that when the N$^+$ regions 118 and 126 are connected to the terminal 106, i.e., smaller than the normal V$_h$. On the other hand, when ESD occurs, the embedded n-channel FET 132 is turned on. The base-emitter junction of the PNP transistor, formed by the P$^+$ region 120 (emitter), the N-well 112 (base), and the P-well 114 (collector), is forward biased. The ESD current flows from the terminal 106, through the P$^+$ region 120, the N-well 112, a channel formed in the channel region 134, the N$^+$ region 124, to the circuit ground 108. Since the N$^+$ regions 118 and 126 are floating and the embedded n-channel transistor is turned on, V$_{tr}$ when ESD occurs (here also referred to as "ESD V$_{tr}$") is reduced as compared to the normal V$_{tr}$. As a consequence, when ESD occurs, the gate-coupled SCR 102 may be turned on at a lower voltage, and thus the turn-on time of the gate-coupled SCR 102 is reduced.

Figure 2:
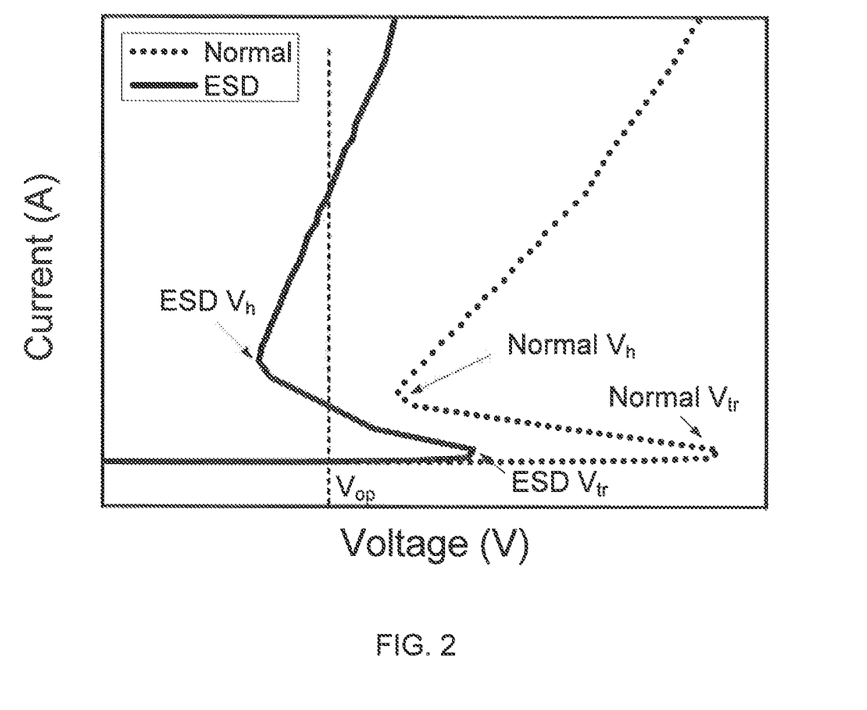
FIG. 2 shows current-voltage curves during normal operation and when an ESD occurs, respectively, of a semiconductor device according to an exemplary embodiment.

FIG. 2 shows the current-voltage curves during normal operation (dashed curve) and when ESD occurs (solid curve) of a semiconductor device consistent with embodiments of the disclosure. In FIG. 2, the vertical dashed line represents V$_{op}$. As seen from FIG. 2, the normal V$_h$ is higher than V$_{op}$, and the ESD V$_{tr}$ is lower than the normal V$_{tr}$. Therefore, the semiconductor device consistent with embodiments of the disclosure can turn on more easily when ESD occurs, and can avoid latch-up during normal operation.

Figure 3:
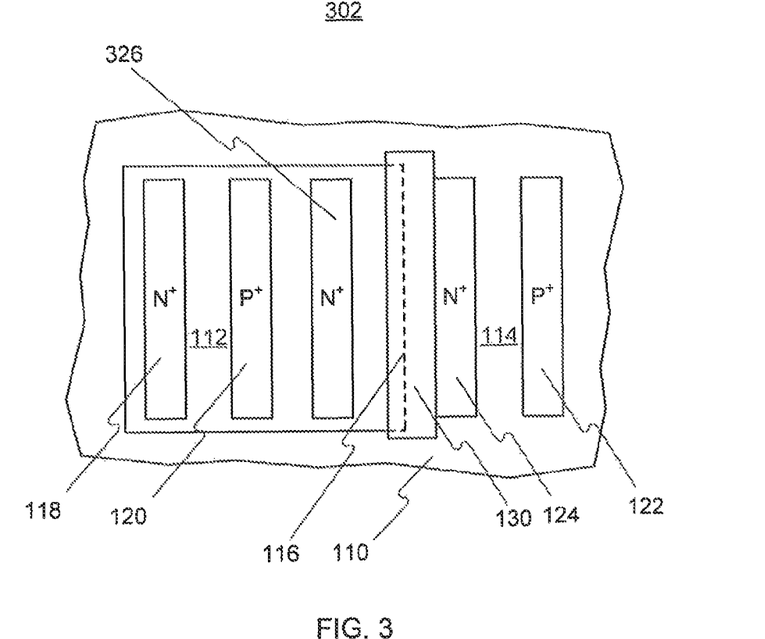
FIG. 3 schematically shows a layout of a gate-coupled silicon-controlled rectifier (SCR) of a semiconductor device according to an exemplary embodiment.
Figure 4:
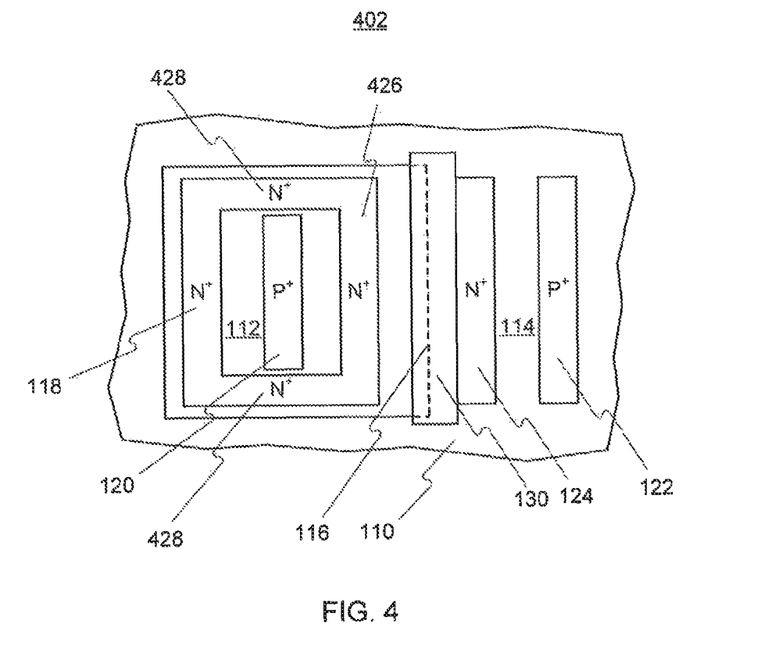
FIG. 4 schematically shows a layout of a gate-coupled SCR of a semiconductor device according to an exemplary embodiment.

FIGS. 3 and 4 show plan views of layouts of exemplary gate-coupled SCR's, 302 and 402, respectively, according to different embodiments of the disclosure. The gate-coupled SCR 302 shown in FIG. 3 is similar to the gate-coupled SCR 102 shown in FIG. 1B, except that an N$^+$ region 326, which serves as the extra N-well pickup in the gate-coupled SCR 302, has an elongated shape extending in the direction substantially parallel to the interface 116 (depicted using a dashed line since it is covered by the gate electrode 130), and thus substantially parallel to the directions along which the other heavily-doped regions 118, 120, 122, and 124 extend.

The gate-coupled SCR 402 shown in FIG. 4 includes an $N^+$ region 426, which serves as the extra N-well pickup and has an elongated shape extending in the direction substantially parallel to the interface 116 (depicted using a dashed line since it is covered by the gate electrode 130). A coupling region 428 is formed in the N-well 112. The coupling region 428 in the gate-coupled SCR 402 is also an $N^+$ region, formed to electrically couple the $N^+$ regions 118 and 426.

Figure 5A:
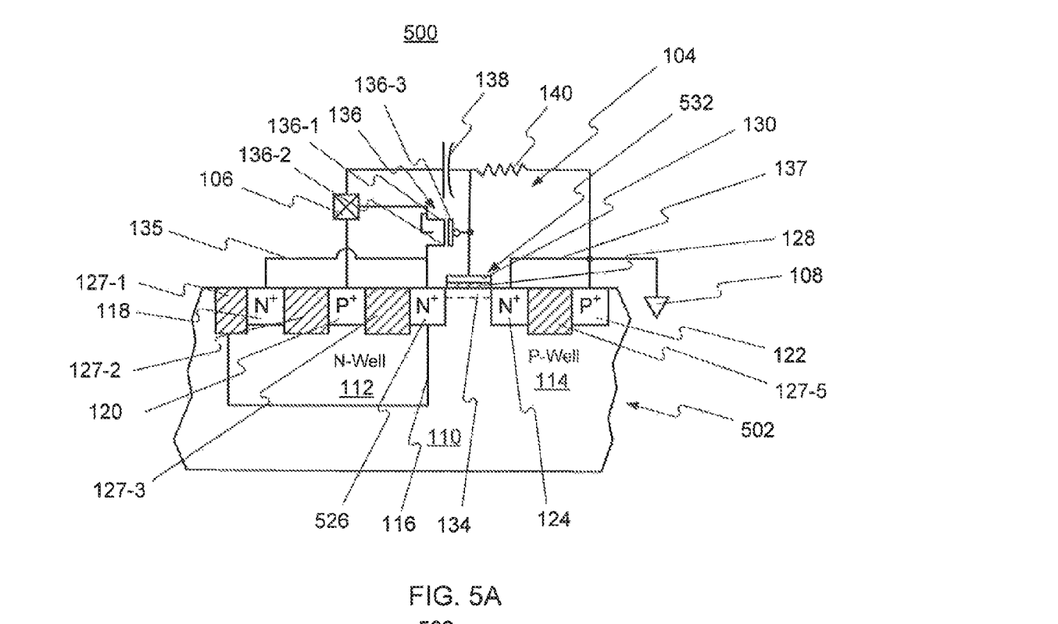
FIGS. 5A and 5B schematically show a semiconductor device according to an exemplary embodiment.

FIG. 5A is a sectional view schematically showing an exemplary semiconductor device 500 consistent with embodiments of the disclosure. The semiconductor device 500 is similar to the semiconductor device 100, except that in a gate-coupled SCR 502 of the semiconductor device 500, an $N^+$ region 526, which serves as the extra N-well pickup in the gate-coupled SCR 502, is not completely formed in the N-well 112. Rather, a portion of the $N^+$ region 526 is formed in the N-well 112 while another portion of the $N^+$ region 526 is formed in the P-well 114. Moreover, the gate-coupled SCR 502 does not have the insulating isolation layer 127-4 formed therein. Similar to the semiconductor device 100, in the semiconductor device 500, the $N^+$ regions 124 and 526, the insulating layer 128, the gate electrode 130, and a region in the substrate 110, particularly in the P-well 114, between the $N^+$ regions 124 and 526, form an embedded n-channel field-effect transistor (FET) 532, with the region in the substrate 110, particularly in the P-well 114, between the $N^+$ regions 124 and 526 serving as the channel region 134.

Figure 5B:
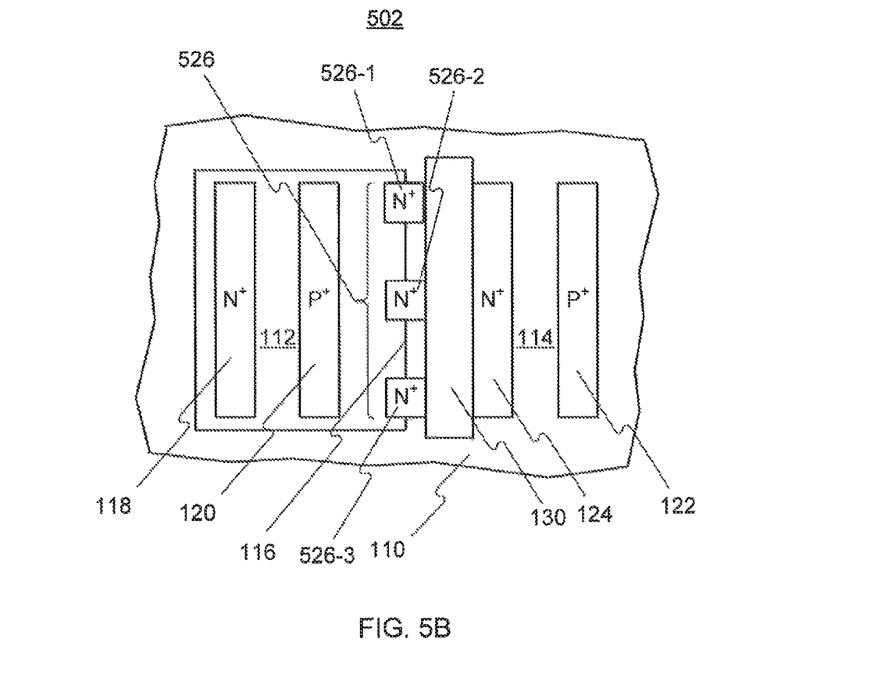

FIG. 5B is a plan view schematically showing the layout of the gate-coupled SCR 502, the $N^+$ region 526 includes a plurality of sub-regions 526-1, 526-2, and 526-3. However, the layout of the semiconductor device 500 is not limited to that shown in FIG. 5B. For example, the $N^+$ region 526 may also have an elongated shape like the $N^+$ region 326 shown in FIG. 3, and may also be electrically coupled to the $N^+$ region 118 through a coupling region like the coupling region 428 shown in FIG. 4.

Figure 6A:
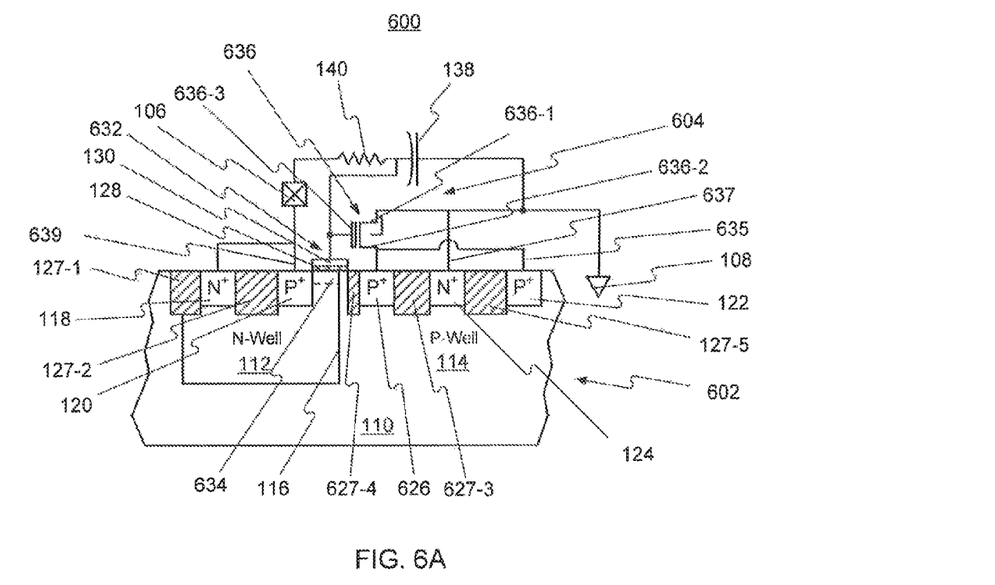
FIGS. 6A and 6B schematically show a semiconductor device according to an exemplary embodiment.

FIG. 6A is a sectional view schematically showing an exemplary semiconductor device 600 consistent with embodiments of the disclosure. The semiconductor device 600 includes a gate-coupled SCR 602 and a switching circuit 604. Different from the semiconductor device 100, in the gate-coupled SCR 602 of the semiconductor device 600, no extra N-well pickup is formed in the N-well 112. Rather, an additional $P^+$ region 626 is formed in the P-well 114 as an extra P-well pickup.

As shown in FIG. 6A, an insulating isolation layer 627-3 is formed in the substrate 110 between the $N^+$ region 124 and the $P^+$ region 626 and near the surface of the substrate 110. Further, an insulating isolation layer 627-4 is formed in the substrate 110 to the left of the $P^+$ region 626 and near the surface of the substrate 110. Similar to the insulating isolation layers 127-1, 127-2, and 127-5, the insulating isolation layers 627-3 and 627-4 may include, for example, field oxides or shallow trench isolations. As shown in FIG. 6A, a right edge of the insulating layer 128 and that of the gate electrode 130 align with a left edge of the insulating isolation layer 627-4. In some embodiments, however, the right edge of the insulating layer 128 and that of the gate electrode 130 may be formed over the insulating isolation layer 627-4.

In the semiconductor device 600, the insulating layer 128 and the gate electrode 130 are formed over a region in the substrate 110 between the $P^+$ regions 120 and 626. The $P^+$ regions 120 and 626, the insulating layer 128, the gate electrode 130, and a region in the substrate 110, particularly in the N-well 112, between the $P^+$ regions 120 and 626 form an embedded p-channel FET 632, in which the region in the substrate 110, particularly in the N-well 112, between the $P^+$ regions 120 and 626 serves as a channel region 634.

As shown in FIG. 6A, the $P^+$ regions 122 and 626 are electrically coupled to each other, as diagrammatically shown by a connection 635. The $N^+$ region 124 is electrically coupled to the circuit ground 108, as diagrammatically shown by a connection 637. The $N^+$ region 118 and the $P^+$ region 120 are electrically coupled to each other and also electrically coupled to the terminal 106, as diagrammatically shown by a connection 639.

Figure 6B:
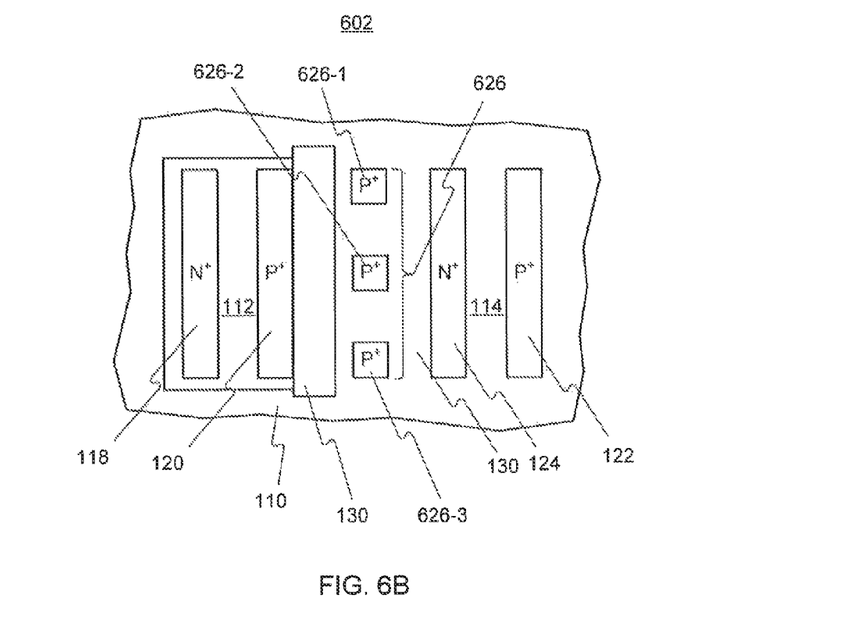

FIG. 6B is a plan view schematically showing the layout of the gate-coupled SCR 602. As shown in FIG. 6B, the $P^+$ region 626 includes a plurality of sub-regions 626-1, 626-2, and 626-3, arranged along a direction substantially parallel to the interface 116. However, the layout of the semiconductor device 600 is not limited to that shown in FIG. 6B. For example, the $P^+$ region 626 may also have an elongated shape like the $N^+$ region 326 shown in FIG. 3, and may also be electrically coupled to the $P^+$ region 122 through a coupling region having a shape like the coupling region 428 shown in FIG. 4 and being a $P^+$ region.

Referring again to FIG. 6A, the switching circuit 604 includes an n-channel FET 636, the capacitor 138, and the resistor 140. The n-channel FET 636 includes a source electrode 636-1 electrically coupled to the circuit ground 108, a drain electrode 636-2 electrically coupled to $P^+$ regions 122 and 626, and a gate electrode 636-3 electrically coupled to the gate electrode 130 of the embedded p-channel FET 632.

The gate electrode 130 of the embedded p-channel FET 632 and the gate electrode 636-3 of the n-channel FET 636 are electrically coupled to the terminal 106 through the resistor 140, and are electrically coupled to the circuit ground 108 through the capacitor 138.

Figure 6C:
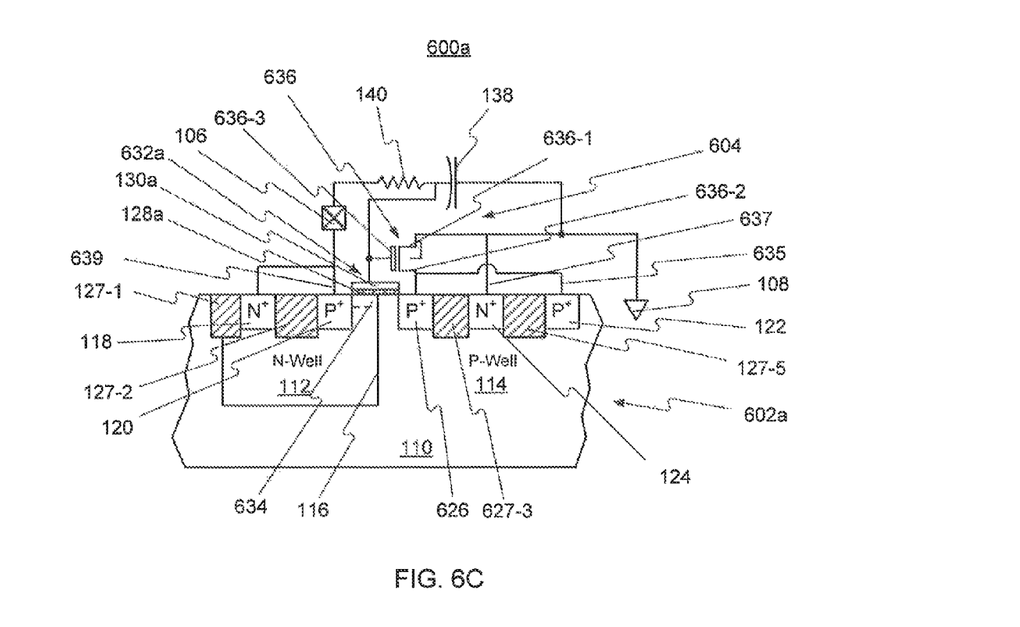
FIGS. 6C and 6D schematically show a modification of the semiconductor device shown in FIGS. 6A and 6B.
Figure 6D:
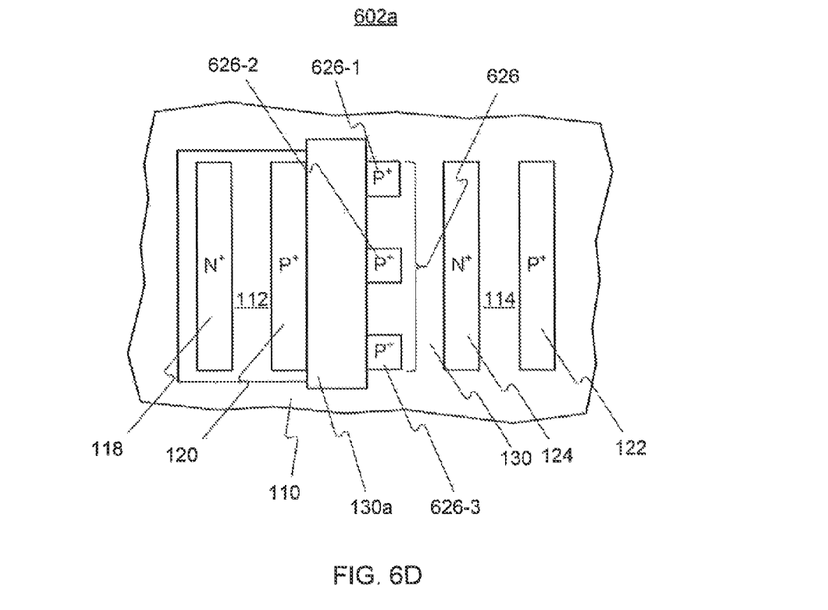

FIGS. 6C and 6D schematically show sectional and plan views, respectively, of a modification, i.e., semiconductor device 600a, of the semiconductor device 600. The semiconductor device 600a differs from the semiconductor device 600 in that a gate-coupled SCR 602a of the semiconductor device 100a does not have the insulating isolation layer 627-4 formed therein. Moreover, in the semiconductor device 600a, an embedded p-channel FET 632a is formed instead of the embedded p-channel FET 632, in which a right edge of the insulating layer 128a and that of the gate electrode 130a align with a left edge of the $P^+$ region 626.

Figure 7A:
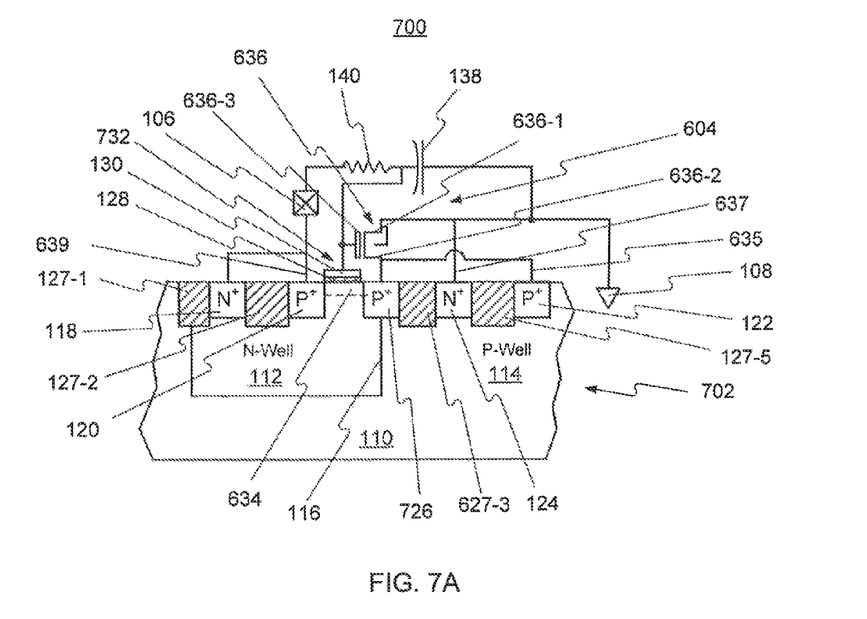
FIGS. 7A and 7B schematically show a semiconductor device according to an exemplary embodiment.

FIG. 7A is a sectional view schematically showing an exemplary semiconductor device 700 consistent with embodiments of the disclosure. The semiconductor device 700 is similar to the semiconductor device 600, except that in a gate-coupled SCR 702 of the semiconductor device 700, a $P^+$ region 726, which serves as the extra P-well pickup in the gate-coupled SCR 702, is not completely formed in the P-well 114. Rather, a portion of the $P^+$ region 726 is formed in the P-well 114 while another portion of the $P^+$ region 726 is formed in the N-well 112. Moreover, the gate-coupled SCR 702 does not have the insulating isolation layer 627-4 formed therein. Similar to the semiconductor device 600, in the semiconductor device 700, the $P^+$ regions 120 and 726, the insulating layer 128, the gate electrode 130, and a region in the substrate 110, particularly in the N-well 112, between the $P^+$ regions 120 and 726 form an embedded p-channel FET 732, with the region in the substrate 110, particularly in the N-well 112, between the $P^+$ regions 120 and 726 serving as the channel region 634.

Figure 7B:
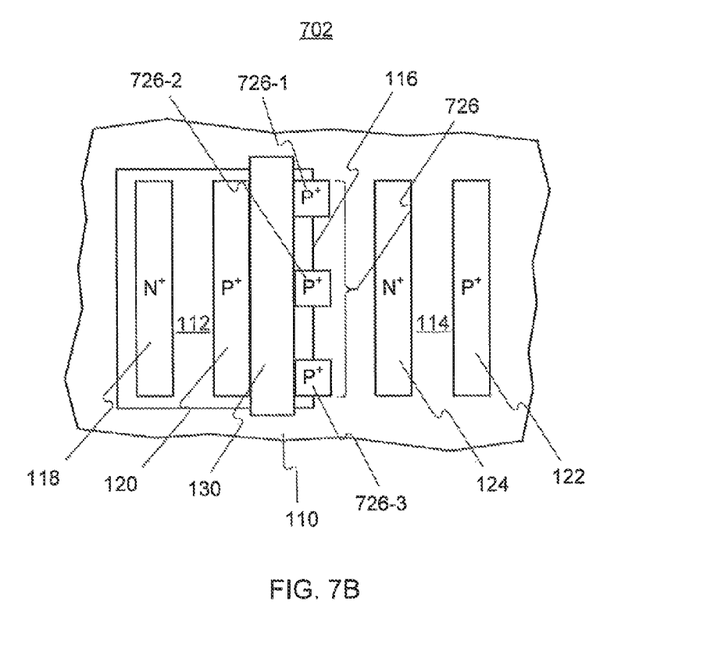

FIG. 7B is a plan view schematically showing the layout of the gate-coupled SCR 702. As shown in FIG. 7B, the $P^+$ region 726 includes a plurality of sub-regions 726-1, 726-2, and 726-3. However, the layout of the semiconductor device 700 is not limited to that shown in FIG. 7B. For example, the P+ region 726 may also have an elongated shape like the N+ region 326 shown in FIG. 3, and may also be electrically coupled to the P+ region 122 through a coupling region having a shape like the coupling region 428 shown in FIG. 4 but being a P+ region.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device, comprising:
   a substrate;
   a first well formed in the substrate, the first well having a first conductivity type;
   a second well formed in the substrate, the second well having a second conductivity type different than the first conductivity type;
   a first heavily-doped region having the first conductivity type, a portion of the first heavily-doped region being formed in the first well;
   a second heavily-doped region having the first conductivity type and formed in the second well;
   an insulating layer formed over a channel region of the substrate between the first and second heavily-doped regions;
   a gate electrode formed over the insulating layer, the gate electrode, the insulating layer, the channel region, and the first and second heavily-doped regions forming an embedded field-effect transistor (FET);
   a terminal for coupling to an external circuit to be protected;
   a switching circuit coupled between the terminal and the first heavily-doped region, and between the terminal and the gate electrode.

2. The semiconductor device of claim 1, further comprising:
   a third heavily-doped region having the first conductivity type and formed in the first well, the third heavily-doped region being electrically coupled to the first heavily-doped region;
   a fourth heavily-doped region having the second conductivity type and formed in the second well, the fourth heavily-doped region being electrically coupled to the second heavily-doped region; and
   a fifth heavily-doped region having the second conductivity type and formed in the first well.

3. The semiconductor device of claim 2, wherein the first conductivity type is N-type conductivity, and the second conductivity type is P-type conductivity.

4. The semiconductor device of claim 3, wherein:
   the gate electrode is a first gate electrode, and
   the switching circuit comprises:
      a p-channel FET comprising:
         a source electrode electrically coupled to the terminal;
         a drain electrode electrically coupled to the first heavily-doped region; and
         a second gate electrode electrically coupled to the first gate electrode; and
      a capacitor, the terminal being coupled to the first gate electrode through the capacitor.

5. The semiconductor device of claim 4, wherein the switching circuit further comprises:
   a resistor, the first gate electrode being coupled to the second heavily-doped region through the resistor.

6. The semiconductor device of claim 3, wherein the fifth heavily-doped region is electrically coupled to the terminal.

7. The semiconductor device of claim 3, wherein the second and fourth heavily-doped regions are electrically coupled to a circuit ground.

8. The semiconductor device of claim 2, wherein the first conductivity type is P-type conductivity, and the second conductivity type is N-type conductivity.

9. The semiconductor device of claim 8, wherein:
   the gate electrode is a first gate electrode, and
   the switching circuit comprises:
      an n-channel FET comprising:
         a source electrode electrically coupled to a circuit ground;
         a drain electrode electrically coupled to the first heavily-doped region; and
         a second gate electrode electrically coupled to the first gate electrode; and
      a resistor, the terminal being coupled to the first gate electrode through the resistor.

10. The semiconductor device of claim 9, wherein the switching circuit further comprises:
    a capacitor, the first gate electrode being coupled to the circuit ground through the capacitor.

11. The semiconductor device of claim 8, wherein the fifth heavily-doped region is electrically coupled to the circuit ground.

12. The semiconductor device of claim 2, further comprising:
    a coupling region formed in the first well and electrically coupling the first and third heavily-doped regions, the coupling region being heavily doped and having the first conductivity type.

13. The semiconductor device of claim 1, wherein:
    the portion of the first heavily-doped region is a first portion, and
    the first heavily-doped region has a second portion formed in the second well.

14. The semiconductor device of claim 1, wherein the first heavily-doped region includes a plurality of sub-regions.

15. The semiconductor device of claim 14, wherein:
    the first and second wells are formed side by side and meet at an interface, and
    the sub-regions are arranged in a direction parallel to the interface.

16. The semiconductor device of claim 1, where in the switching circuit is configured to:
    electrically connect the first heavily-doped region to the terminal and turn off the embedded FET during normal operation, and
    electrically disconnect the first heavily-doped region from the terminal and turn on the embedded FET when an electrostatic discharge occurs at the terminal.

* * * * *